United States Patent [19]

Arai

[11] Patent Number: 5,189,378
[45] Date of Patent: Feb. 23, 1993

[54] TONE SIGNAL DETECTING CIRCUIT
[75] Inventor: Masanobu Arai, Tokyo, Japan
[73] Assignee: NEC Corporation, Tokyo, Japan
[21] Appl. No.: 756,067
[22] Filed: Sep. 6, 1991

[30] Foreign Application Priority Data

Sep. 12, 1990 [JP] Japan .................. 2-239951
Sep. 13, 1990 [JP] Japan .................. 2-241274

[51] Int. Cl.[5] .................. H03K 9/06; H03K 5/22
[52] U.S. Cl. .................. 328/138; 328/140; 307/231
[58] Field of Search .......... 328/136, 138, 139, 140, 328/141; 307/231, 510, 522, 523; 340/146.2

[56] References Cited

U.S. PATENT DOCUMENTS

| | | | |
|---|---|---|---|
| 4,127,824 | 11/1978 | Bennett, Jr. | 328/138 |
| 4,312,044 | 1/1982 | Baba | 328/141 |
| 4,675,612 | 6/1987 | Adams et al. | 328/63 |
| 4,747,131 | 5/1988 | Beirne | 379/3 |
| 4,748,438 | 5/1988 | Mickeal | 340/146.2 |
| 4,868,872 | 9/1989 | Roberts et al. | 379/386 |

*Primary Examiner*—Jin F. Ng
*Assistant Examiner*—Sinh Tran

[57] ABSTRACT

A tone signal detecting circuit includes a sampling circuit, a storage circuit, and a comparing circuit. The sampling circuit samples a tone signal at a sampling rate N times (N is a natural number) higher than a frequency f of the one signal. The storage circuit stores M (M is a natural number) latest values of time series data from the sampling circuit. The comparing circuit compares a plurality of polarity patterns expected on the basis of a tone signal with polarity patterns stored in the storage circuit and outputting coincidence outputs.

9 Claims, 6 Drawing Sheets

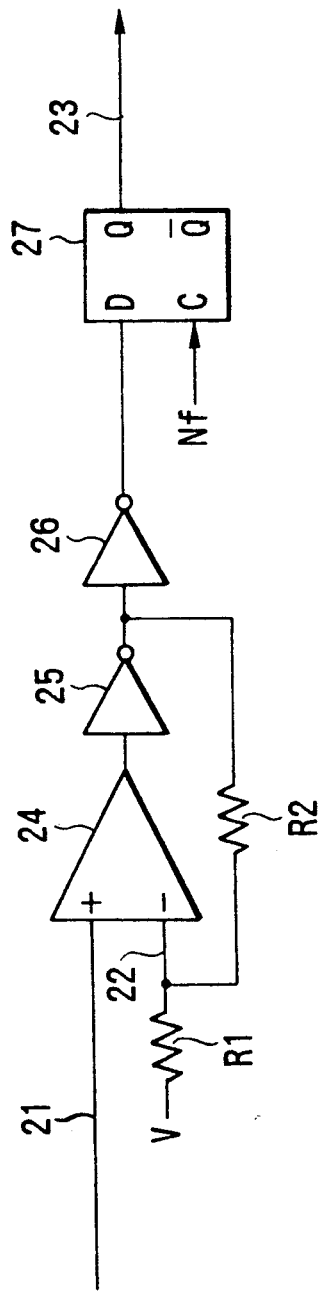
F I G. 4
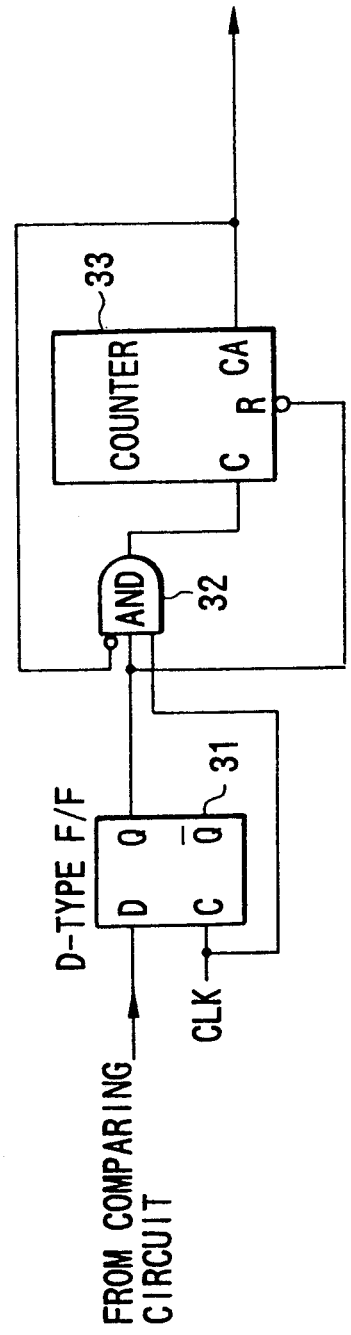
F I G. 5

TONE SIGNAL DETECTING CIRCUIT

BACKGROUND OF THE INVENTION

The present invention relates to a signal detecting circuit and, more particularly, to a tone signal detecting circuit.

Conventional tone signal detecting circuits are used for many applications. These circuits can be classified, in terms of basic arrangements, into circuits using analog resonance circuits and circuits using digital signal processors. On the other hand, with the recent advances in LSI technology, a system-on-the-chip has been almost realized, leading to a rapid reduction in size of circuits and apparatuses. Under these circumstances, attempts have been made to reduce the size of a tone signal detecting circuit by using the LSI technology.

In the above-mentioned conventional tone detecting circuits, especially the circuit using an analog resonance circuit, an external part for an LSI is required as a resonance circuit. Even if a resonance circuit is realized within an LSI, since the resultant structure is an analog LSI, the benefit of the advanced micropatterning technique of a digital LSI cannot be enjoyed. Therefore, it is difficult to achieve a further reduction in size. Although the circuit using a digital signal processor can enjoy the benefit of the micropatterning technique of a digital LSI, it requires a processor constituted by gates having at least several kbytes. Therefore, it is difficult to further reduce the size of a circuit on the LSI. In addition, in such a tone detecting circuit, it is important to inhibit detection of tone signals having small amplitudes. That is, it is important to realize a tone detecting circuit which does not detect tone signals having small amplitudes with a simple circuit arrangement.

SUMMARY OF THE INVENTION

It is an object of the present invention to provide a tone signal detecting circuit which allows a further reduction in size of a circuit.

It is another object of the present invention to provide a tone signal detecting circuit which can be formed into a digital LSI by using gate circuits.

It is still another object of the present invention to provide a simple tone signal detecting circuit which can prevent an operation error caused by a small-amplitude tone.

In order to achieve the above objects, according to the present invention, there is provided a tone signal detecting circuit comprising a sampling circuit for sampling a tone signal at a sampling rate N times (N is a natural number) higher than a frequency f of the tone signal, a storage circuit for storing M (M is a natural number) latest values of time series data from the sampling circuit, and a comparing circuit for comparing a plurality of polarity patterns expected on the basis of the tone signal with polarity patterns stored in the storage circuit and outputting coincidence outputs.

BRIEF DESCRIPTION OF THE DRAWINGS

FIG. 4 is a block diagram showing an arrangement of a sampling circuit;

FIG. 5 is a block diagram showing an arrangement of a determining circuit;

DESCRIPTION OF THE PREFERRED EMBODIMENTS

Figure 1:
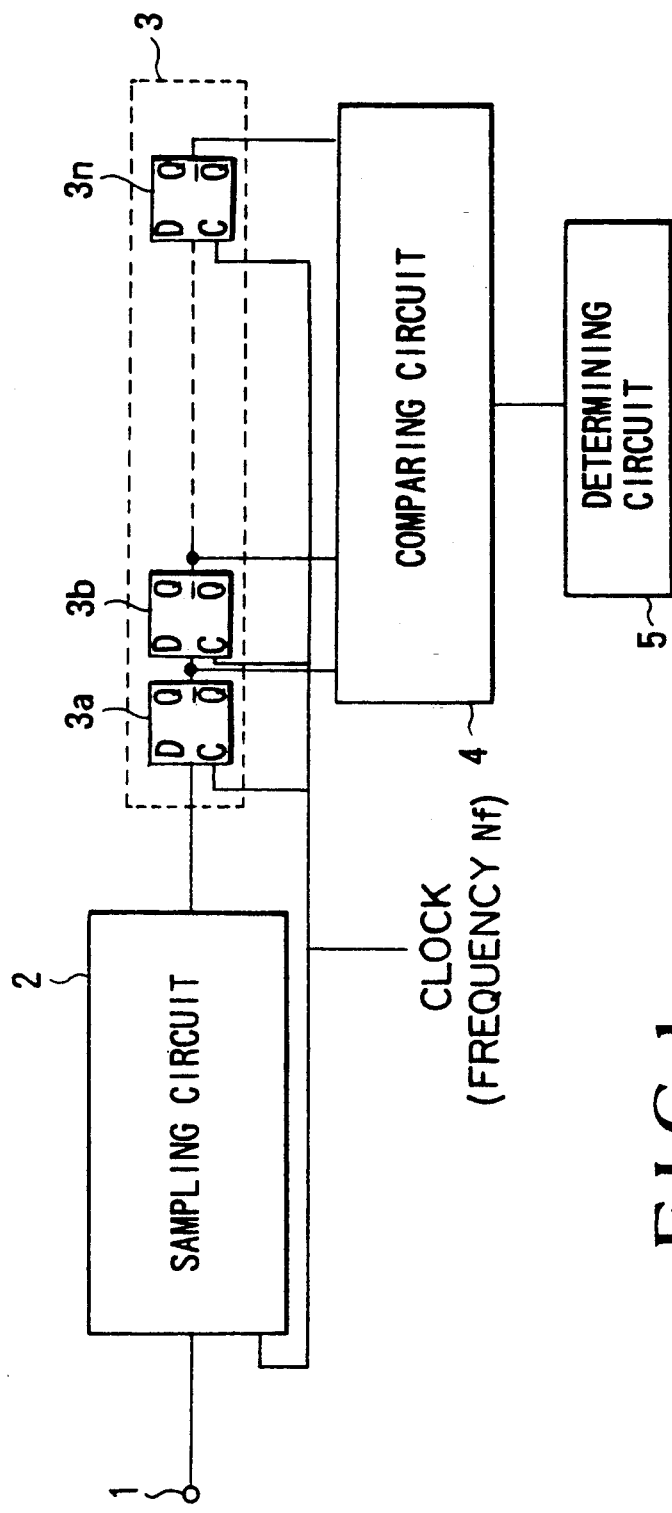
FIG. 1 is a block diagram showing a tone signal detecting circuit according to an embodiment of the present invention.

FIG. 1 shows a tone signal detecting circuit according to an embodiment of the present invention. Referring to FIG. 1, reference numeral 1 denotes an input terminal; 2, a sampling circuit for sampling a tone signal as an input signal having a frequency N times a frequency f of the tone signal, and for identifying the polarities of sampled signals to form a time series of the polarities of the sampled signals; 3, a storage circuit constituted by N D-type flip-flops 3a to 3n as storage units and designed to shift and accumulate N latest values of this times series; 4, a comparing circuit for comparing N polarity time series patterns, expected to appear upon input of the tone signal, with the polarity patterns actually stored in the storage circuit 3, and calculating the logical OR of N comparison results; and 5, a determining circuit for determining the present/absence of a tone signal on the basis of an output from the comparing circuit 3.

Note that the N polarity time series patterns expected to appear upon input of the tone signal are constituted by cyclically shifting a series of N polarity values N times. This series of N values is constituted by (N/2−1) positive polarities (to be referred to as "+" hereinafter), one undefined polarity (to be referred to as "x" hereinafter), (N/2−1) negative polarities (to be referred to as "−" hereinafter), and one undefined polarity "x" arranged in the order named.

Figure 2:
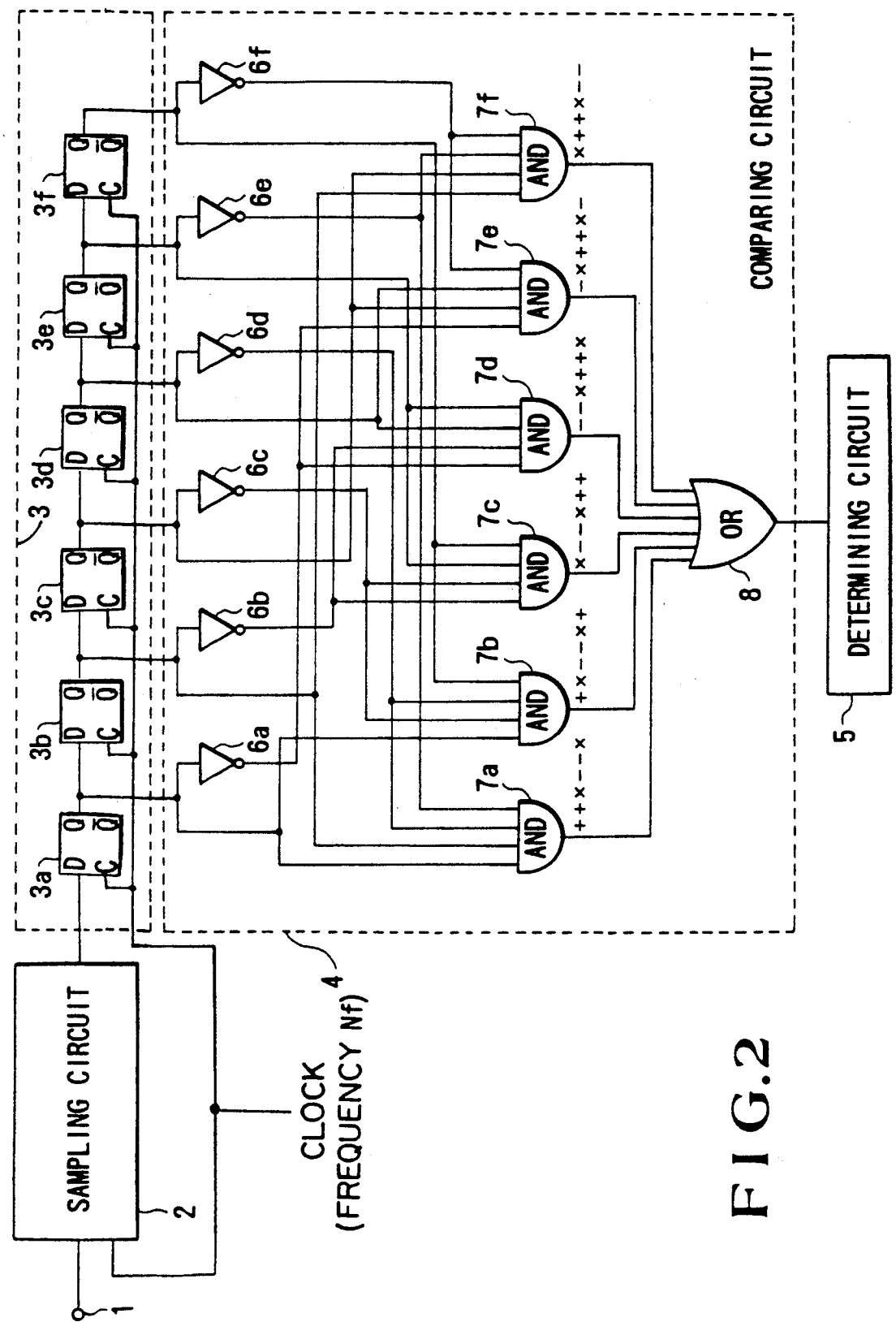
FIG. 2 is a block diagram showing an arrangement in which N=6 is set in the tone signal detecting circuit in FIG. 1.

An operation of the tone signal detecting circuit having the above-described arrangement will be described below. For the sake of descriptive convenience, FIG. 2 shows a circuit arrangement in which N=M=6 is set, and FIGS. 3a to 3f respectively show six polarity time series to be stored with respect to six phases of a tone signal. In the comparing circuit 4 shown in FIG. 2, reference numerals 6a to 6f denote inverter circuits; 7a to 7f, AND circuits; and 8, an OR circuit. The AND circuit 7a outputs a "1"-level signal upon reception of phase polarity pattern "+++−−−" shown in FIG. 3a. The AND circuit 7f outputs a "1"-level signal upon reception of phase polarity pattern "−+++−−" shown in FIG. 3b. Similarly, the AND circuits 7e, 7d, 7c, and 7b outputs "1"-level signals when they respectively receive phase polarity patterns "−−+++−", "−−−+++", "+−−−++", and "++−−−+" respectively shown in FIGS. 3c, 3d, 3e, and 3f.

Figure 3:
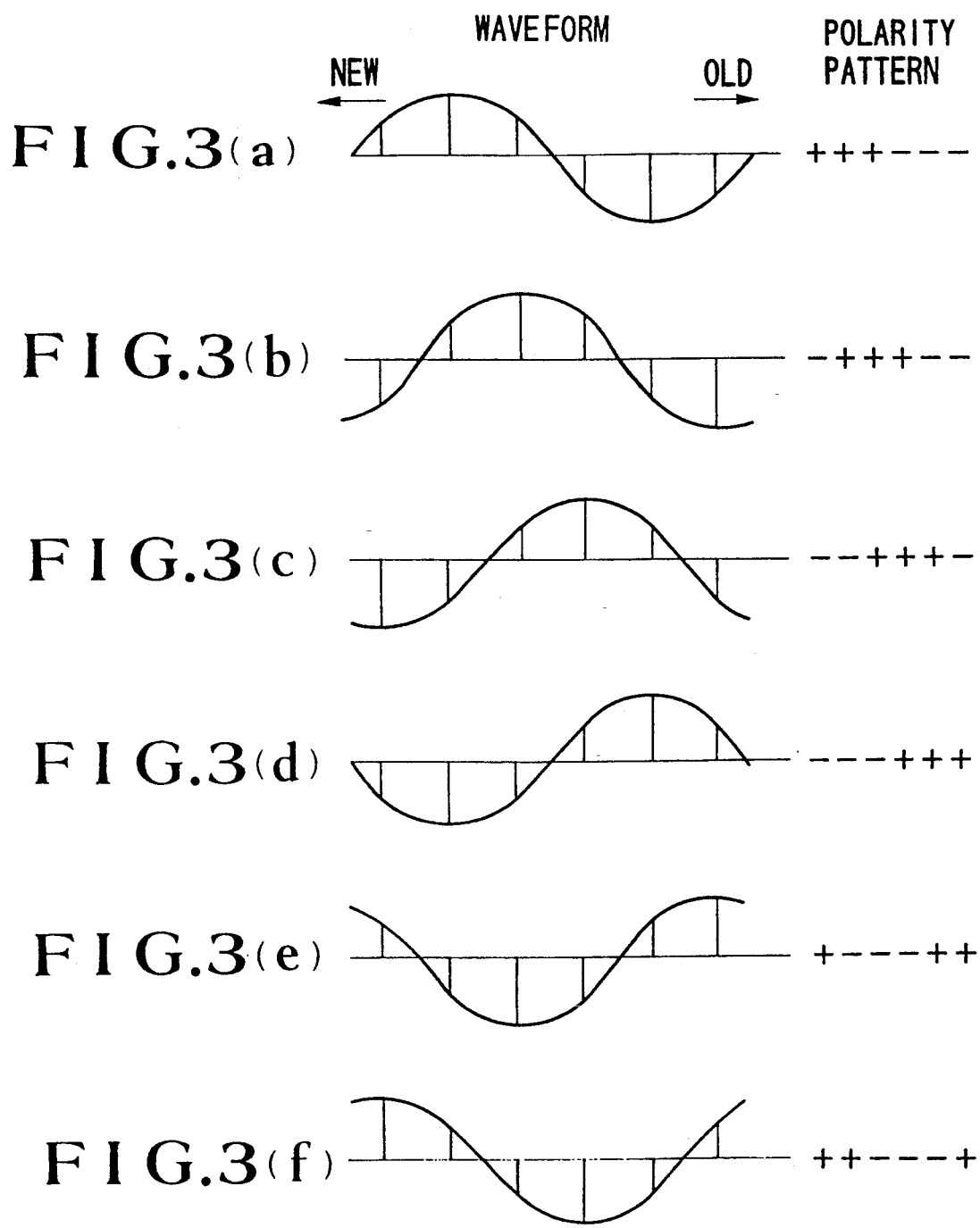
FIGS. 3a to 3f are charts of waveforms and polarity patterns for explaining an operation of the circuit in FIG. 2.

If, therefore, polarity pattern "+++−−−" shown in FIG. 3a is stored in the storage units 3a to 3f of the storage circuit 3 at a given timing, the AND circuit 7a of the comparing circuit 4 calculates the logical AND and outputs a "1"-level signal. When the next sampled data is received, since the waveform and the polarity pattern are changed to "−+++−−" as shown in FIG. 3b, the AND circuit 7b calculates the logical AND and outputs a "1"-level signal. For this reason, if the tone signal is continuous, its waveform and polarity pattern are changed as follows: FIG. 3c→FIG. 3d→FIG. 3e→FIG. 3f. Therefore, the comparing circuit 4 checks the coincidence of N=6 phase polarity time series patterns with actual polarity patterns. If a tone signal is received, one of the AND circuit 7a to 7f outputs a "1"-level signal, and coincidence sequentially occurs in the remaining AND circuits. When the OR circuit 8 calculates the logical OR of the outputs from the AND circuits 7a to 7f, the output of the circuit 8 is continuously set at level "1". If, for example, the determining circuit 5 determines whether this state continues for a predetermined period of time, the tone signal can be detected.

When an input tone signal is sampled at a position near a zero-crossing point, the polarity of a stored pattern may be inverted due to the influences of noise. As a result, any one of the AND circuits 7a to 7f does not output a "1"-level signal. In order to prevent such inconvenience, undefined polarity "x" is added to a pattern expected to appear upon input of a tone signal. More specifically, this problem can be solved by adding undefined polarity "x" at a portion where "+" and "−" of an expected pattern are switched from each other. The AND circuit 7a of the comparing circuit 4 checks the correlation between the stored pattern and pattern "++x−−x". Similarly, the AND circuits 7b, 7c, 7d, 7e, and 7f respectively check the correlation between the stored patterns with patterns "+x−−x+", "x−−x++", "−−x++x", "−x++x−", and "x++x−−". In practice, the AND circuits 7a to 7f respectively receive outputs, from the storage units 3a to 3f and the inverter circuits 6a to 6f, which correspond to two positive polarities "+" and two negative polarities "−", and compare polarity patterns by using four data of six polarity time series data. However, the circuits 7a to 7f receive no output corresponding to undefined polarity "x" and hence do not use it for pattern determination.

When a tone signal having a small amplitude is input, the following operation is performed. FIG. 4 shows an arrangement of a sampling circuit whose input/output characteristics have a hysteresis characteristic to prevent a variation in output with respect to a tone signal having a small amplitude. Referring to FIG. 4, reference numeral 21 denotes a tone signal input; 22, a threshold voltage for discriminating polarities, which changes at the voltage division ratio between resistors R1 and R2 as the output of the inverter 25 changes; 24, a comparator; 25 and 26, inverters; and 27, a D-type flip-flop having a clock terminal to which a clock Nf having a frequency N times a tone frequency f to be detected is input. When a tone signal having a small amplitude is input, if, for example, the input 21 exceeds the voltage 22, at one terminal, as the threshold value of the comparator 24, the output of the comparator 24 becomes "+". When the output of the comparator 24 becomes "+", the threshold value 22 of the comparator 24 is fed back though the inverter 25 and the resisters R1 and R2, and the threshold voltage is decreased. This feedback mechanism generates hysterisis characteristics between the input 21 and the output of the comparator 24. Therefore, with a small amplitude variation, the input 21 is kept higher than the threshold voltage, and the output of the comparator 24 is not set to be "−". If the sampling circuit continuously outputs "+", the comparing circuit 4 does not output a "1"-level signal.

Hence, the determining circuit 5 does not detect a tone signal.

The determining circuit 5 can be realized by a circuit for continuously detecting "1"-level outputs from the comparing circuit 4K times, which is constituted by, e.g., a D-type F/F 31, an AND circuit 32, and a counter 33 which outputs a "1"-level signal as CA when it counts a clock (i.e., input C) K times, as shown in FIG. 5.

Figure 6:
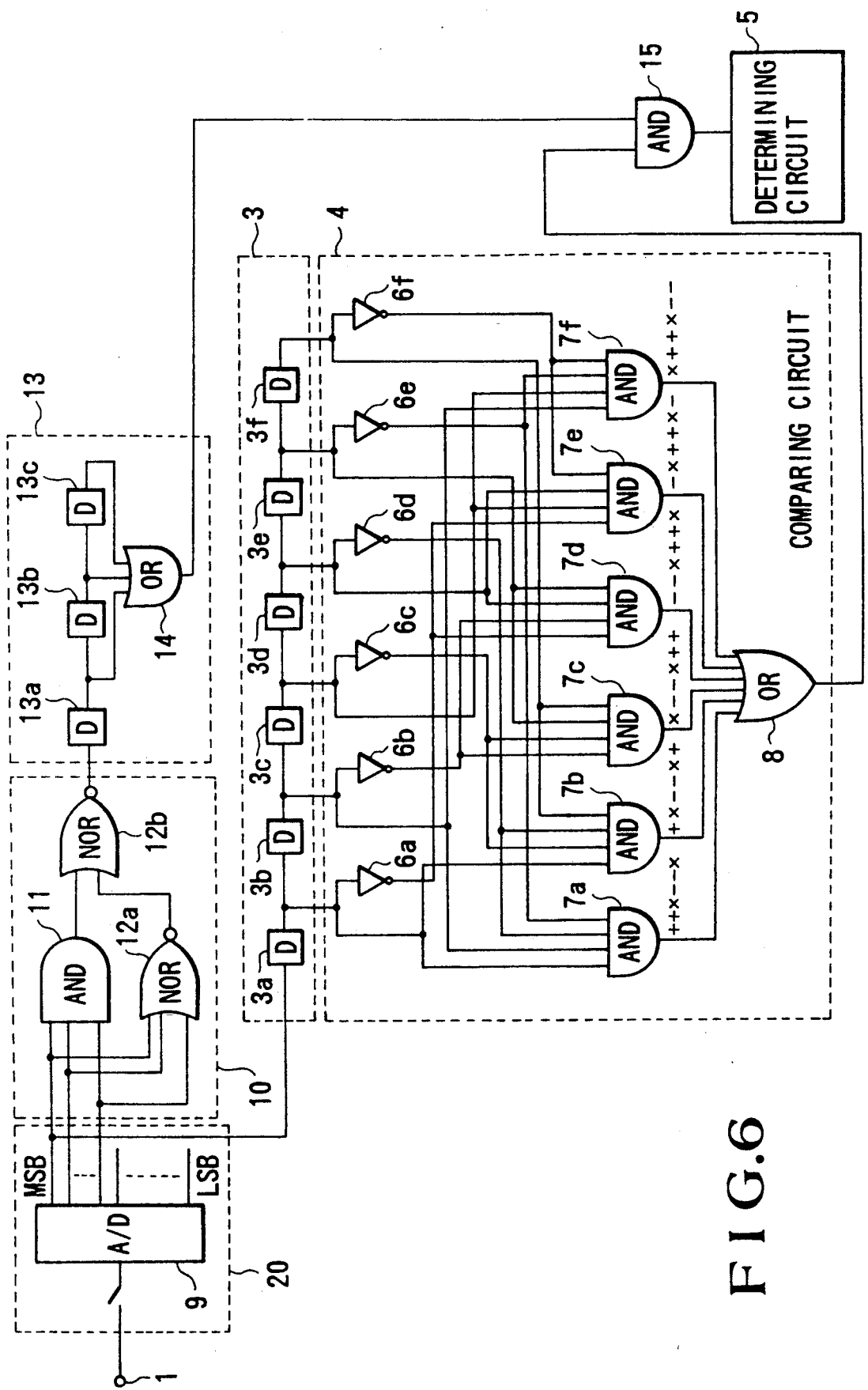
FIG. 6 is a block diagram showing another embodiment of the present invention.

FIG. 6 is a block diagram showing a tone signal detecting circuit according to another embodiment of the present invention. This circuit is designed to prevent detection of a tone generated by crosstalk of a small amplitude which, for example, is caused when similar tone signals are used at neighboring places. Referring to FIG. 6, reference numeral 9 denotes an A/D converter which is arranged in a sampling circuit 20 to perform A/D conversion of a twos complement with respect to a sampled signal; 10, a small amplitude detecting circuit constituted by an AND circuit 11 and NOR circuits 12a and 12b and designed to determine that the amplitude of an output, from the A/D converter 9, which is subjected to display of a twos complement, is small if all the upper bits of the output are "1" or "0"; 13, a non-signal detecting circuit constituted by storage units 13a to 13c and an OR circuit 14 and designed to detect a non-signal when all latest I (I is a natural number, and I=3 in this case) time series output from the small amplitude detecting circuit 10 have small amplitudes (in this case, "0s" are output); and 15, an AND circuit for calculating the logical AND of outputs from the comparing circuit 4 described above and the non-signal detecting circuit 13. Even if the comparing circuit 4 detects the coincidence of a tone signal, the AND circuit 15 inhibits output of the coincidence signal to the determining circuit 5 when an output from the non-signal detecting circuit 13 indicates a non-signal.

Note that FIG. 6 shows a case wherein N=M=6, and I=N/2=3. Since I=3 corresponds to the half period of a tone signal, and one of three sampled signals has close value to the tone peak amplitude, it is substantially determined whether this peak amplitude exceeds a certain level. In addition, the number of upper bits processed by the small amplitude detecting circuit 10 is set such that a certain level is set between the minimum tone level and the tone level based on crosstalk.

An operation of the tone signal detecting circuit having the above-described arrangement will be described below. The sampling circuit 20 performs A/D conversion of a twos complement with respect to a sampled signal. If all the upper bits of an output, from the A/D converter 9, which is subjected to display of a twos complement, are "1" or "0", the small amplitude detecting circuit 10 determines, by using the AND circuit 11 or the NOR circuit 12a, that the amplitude of the sampled signal is small. In this case, a "0"-level signal is output from the NOR circuit 12b. If the non-signal determining circuit 13 determines on the basis of outputs from the storage units 13a to 13c that all the latest three (I=3) time series output from the amplitude detecting circuit 10 have small amplitudes, the circuit 13 determines a non-signal and outputs a "0"-level signal to the AND circuit 15 by using the OR circuit 14. Therefore, even if the comparing circuit 4 detects the coincidence of a tone signal, the AND circuit 15 inhibits output of a coincidence signal to the determining circuit 5 when the non-signal detecting circuit 13 detects a non-signal. In this case, the comparing circuit 4 may be directly disabled by the output from the non-signal detecting circuit 13.

Figure 7:
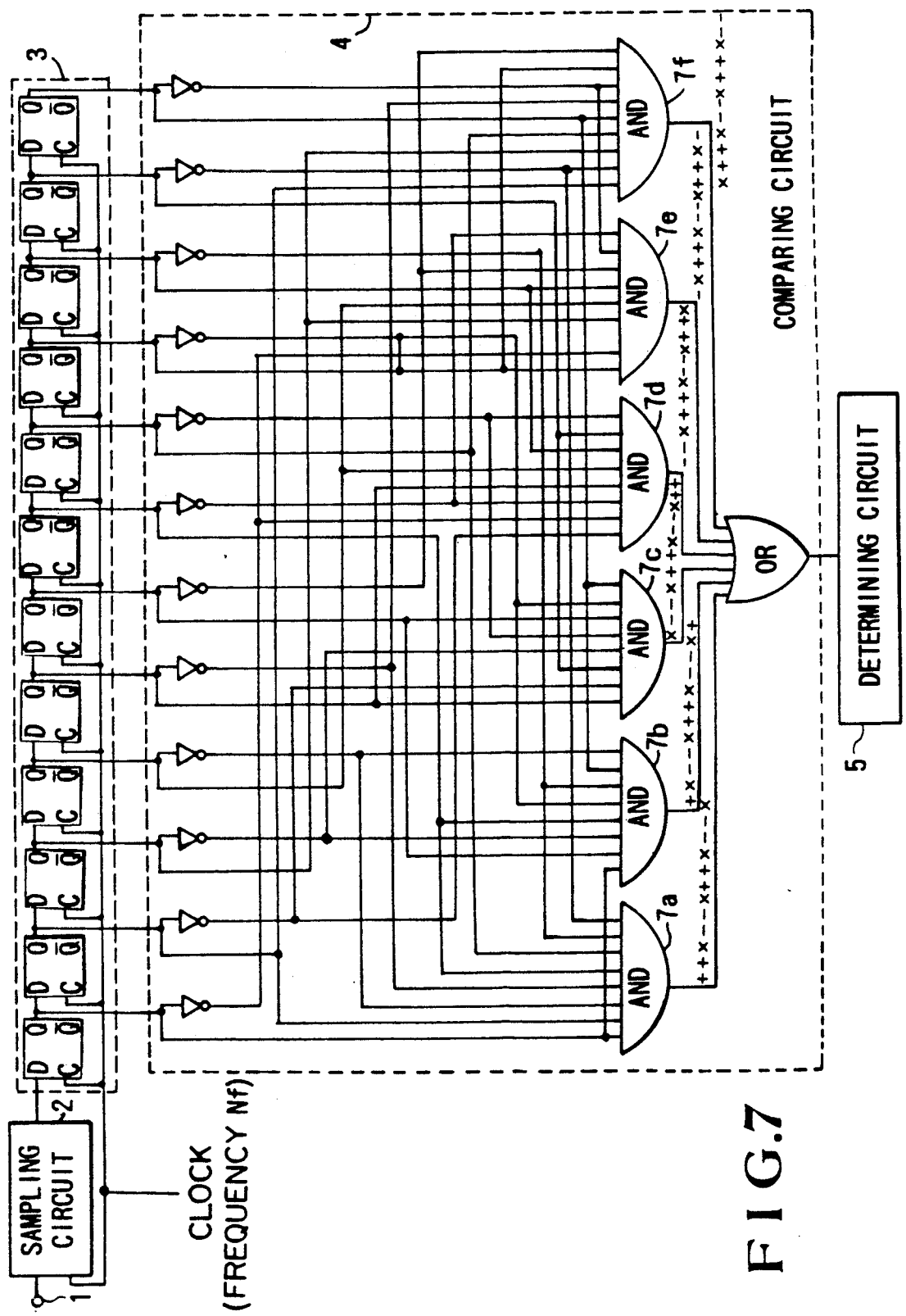
FIG. 7 is a block diagram showing an arrangement in which M is not equal to N.

FIG. 7 shows a case wherein M=2N (M≠N). Tone signals of M=2N are stored and compared with the two-cycle-signal of N polarity time series pattern.

In the above embodiments, a tone signal having a singe wave is exemplified. However, the present invention is not limited to this. It is apparent that the present invention can be equally applied to a tone signal having a rectangular wave.

As has been described in detail above, according to the tone signal detecting circuit of the present invention, since a processor can be constituted by several tens gates, a simple arrangement can be achieved, and a reduction in size can be realized in the formation of an LSI. In addition, a signal which is not a tone signal is not erroneously determined as a tone signal, and an operation error due to noise can be prevented. Furthermore, a circuit which does not detect a tone signal having a small amplitude can be easily formed.

What is claimed is:

1. A tone signal detecting circuit comprising:
    a sampling circuit for sampling a polarity of a tone signal at a sampling rate N times (N is a natural number) higher than a frequency f of the tone signal and outputting sampling polarities as time series data;
    a storage circuit for storing M (M is a natural number) latest values of polarity patterns of said time series data which are output from said sampling circuit;
    a comparing circuit for comparing a plurality of polarity patterns expected to appear upon input of the tone signal with polarity patterns stored in said storage circuit and outputting coincidence outputs; and
    a determining circuit for detecting a tone signal by determining whether an output from said comparing circuit continues for not less than a predetermined period of time.

2. A circuit according to claim 1, wherein said comparing circuit has preset N polarity patterns constituted by M time series data.

3. A circuit according to claim 1, wherein said comparing circuit compares polarity data corresponding to a predetermined phase of the tone signal in the M time series data.

4. A circuit according to claim 1, wherein the plurality of expected time series patterns are N polarity patterns obtained by cyclically shifting a pattern formed by continuously arranging (N/2−1) continuous positive polarity data, one undefined data, (N/2−1) continuous negative polarity data, and one undefined data.

5. A circuit according to claim 1, wherein said comparing circuit includes a plurality of coincidence circuits for detecting coincidence of each of the plurality of expected polarity patterns with a corresponding one of the polarity patterns stored in said storage circuit, and an OR circuit for calculating a logical OR of outputs from said coincidence circuits.

6. A circuit according to claim 1, wherein said sampling circuit has a hysteresis characteristic as one of input/output characteristics to prevent variations in output with respect to a tone signal having a small amplitude.

7. A circuit according to claim 1, further comprising a small amplitude detecting circuit for detecting a small amplitude on the basis of an output from said sampling circuit, a non-signal determining circuit for determining a non-signal when all I (I is a natural number) latest time series data output from said small amplitude detecting circuit correspond to small amplitudes, and disable means for disabling said comparing circuit in response to an output from said non-signal determining circuit.

8. A circuit according to claim 7, wherein said disable means is a gate circuit for gating an output from said comparing circuit in response to an output from said non-signal determining circuit.

9. A circuit according to claim 8, wherein said sampling circuit includes an A/D converter for obtaining digital data by performing A/D conversion of a signal amplitude, and said small amplitude detecting circuit detects a small amplitude on the basis of logic of a plurality of upper bits of the digital data obtained by said A/D converter.

* * * * *